(12) United States Patent
Fujimura et al.

(10) Patent No.: US 9,372,391 B2
(45) Date of Patent: Jun. 21, 2016

(54) METHOD AND SYSTEM FOR FORMING PATTERNS USING CHARGED PARTICLE BEAM LITHOGRAPHY WITH VARIABLE PATTERN DOSAGE

(71) Applicant: D2S, Inc., San Jose, CA (US)

(72) Inventors: Akira Fujimura, Saratoga, CA (US); Harold Robert Zable, Palo Alto, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 14/809,188

(22) Filed: Jul. 25, 2015

(65) Prior Publication Data

US 2015/0331991 A1 Nov. 19, 2015

Related U.S. Application Data

(63) Continuation of application No. 13/329,315, filed on Dec. 18, 2011, now abandoned, which is a continuation-in-part of application No. 13/037,263, filed on Feb. 28, 2011, now abandoned, application No. 14/809,188, which is a continuation-in-part of application No. 14/552,360, filed on Nov. 24, 2014, now Pat. No. 9,268,214, which is a continuation of application No. 14/108,135, filed on Dec. 16, 2013, now Pat. No. 8,900,778, which is a continuation of application No. 13/723,181, filed on Dec. 20, 2012, now Pat. No. 8,609,306, which is a continuation of application No. 13/282,446, filed on Oct. 26, 2011, now Pat. No. 8,354,207, which is a continuation of application No. 12/540,322, filed on Aug. 12, 2009, now Pat. No. 8,057,970, which is a continuation-in-part of application No. 12/202,364, filed on Sep. 1, 2008, now Pat. No. 7,759,026, and a continuation-in-part of application No. 12/473,241, filed on May 27, 2009, now Pat. No. 7,754,401.

(60) Provisional application No. 61/224,849, filed on Jul. 10, 2009.

(51) Int. Cl.
| | |
|---|---|
| G03F 1/20 | (2012.01) |
| G03F 1/36 | (2012.01) |
| G03F 7/20 | (2006.01) |
| G06F 17/50 | (2006.01) |
| H01J 37/317 | (2006.01) |
| G03F 1/70 | (2012.01) |
| G03F 1/78 | (2012.01) |
| H01J 37/302 | (2006.01) |
| B82Y 10/00 | (2011.01) |
| B82Y 40/00 | (2011.01) |

(52) U.S. Cl.
CPC . *G03F 1/20* (2013.01); *B82Y 10/00* (2013.01); *B82Y 40/00* (2013.01); *G03F 1/70* (2013.01); *G03F 1/78* (2013.01); *G03F 7/20* (2013.01); *G03F 7/2037* (2013.01); *G03F 7/2063* (2013.01); *G03F 7/7025* (2013.01); *G06F 17/50* (2013.01); *G06F 17/5068* (2013.01); *G06F 17/5081* (2013.01); *H01J 37/3026* (2013.01); *H01J 37/3174* (2013.01); *H01J 37/3177* (2013.01); *H01J 2237/31764* (2013.01); *H01J 2237/31771* (2013.01); *H01J 2237/31776* (2013.01); *Y10S 430/143* (2013.01)

(58) Field of Classification Search
CPC ............... G03F 1/20; G03F 1/70; G03F 1/78; G03F 7/20; G03F 7/2037; G03F 7/2063; G03F 7/7025; G06F 17/50; G06F 17/5068; G06F 17/5081; G06F 2217/12; H01J 37/3174; B82Y 10/00; B82Y 40/00; Y10S 430/143
USPC ............. 430/5, 30, 296, 396, 942; 716/53, 55
See application file for complete search history.

(56) References Cited

U.S. PATENT DOCUMENTS

| | | | |
|---|---|---|---|
| 4,264,711 | A | 4/1981 | Greeneich |
| 4,634,871 | A | 1/1987 | Knauer |
| 4,698,509 | A | 10/1987 | Wells et al. |
| 4,712,013 | A | 12/1987 | Nishimura |
| 4,818,885 | A | 4/1989 | Davis et al. |
| 4,825,033 | A | 4/1989 | Beasley |
| 5,051,598 | A | 9/1991 | Ashton et al. |
| 5,082,762 | A | 1/1992 | Takahashi |
| 5,103,101 | A | 4/1992 | Berglund et al. |

(Continued)

FOREIGN PATENT DOCUMENTS

| | | |
|---|---|---|
| CN | 1193810 A | 9/1998 |
| EP | 1429368 A2 | 6/2004 |

(Continued)

OTHER PUBLICATIONS

Office Action dated Feb. 6, 2015 for U.S. Appl. No. 13/862,475.

(Continued)

*Primary Examiner* — Christopher Young

(74) *Attorney, Agent, or Firm* — The Mueller Law Office, P.C.

(57) ABSTRACT

A method and system for fracturing or mask data preparation or optical proximity correction or proximity effect correction or mask process correction is disclosed in which a set of shaped beam shots is determined that is capable of forming a pattern on a surface, where the set of shots provides different dosages to different parts of the pattern, and where the dose margin from the set of shots is calculated. A method for forming patterns on a surface is also disclosed.

25 Claims, 8 Drawing Sheets

(56) References Cited

U.S. PATENT DOCUMENTS

| | | |
|---|---|---|
| 5,173,582 A | 12/1992 | Sakamoto et al. |
| 5,334,282 A | 8/1994 | Nakayama et al. |
| 5,723,237 A | 3/1998 | Kobayashi et al. |
| 5,804,339 A | 9/1998 | Kim |
| 5,825,039 A | 10/1998 | Hartley |
| 5,856,677 A | 1/1999 | Okino |
| 5,885,747 A | 3/1999 | Yamasaki et al. |
| 5,885,748 A | 3/1999 | Ohnuma |
| 6,001,513 A | 12/1999 | Hector |
| 6,049,085 A | 4/2000 | Ema |
| 6,087,046 A | 7/2000 | Nakasuji |
| 6,218,671 B1 | 4/2001 | Gordon et al. |
| 6,262,427 B1 | 7/2001 | Gordon |
| 6,291,119 B2 | 9/2001 | Choi et al. |
| 6,298,473 B1 | 10/2001 | Ono et al. |
| 6,372,391 B1 | 4/2002 | Wolfe et al. |
| 6,433,348 B1 | 8/2002 | Abboud et al. |
| 6,544,700 B2 | 4/2003 | Ogino |
| 6,557,162 B1 | 4/2003 | Pierrat |
| 6,610,989 B1 | 8/2003 | Takahashi |
| 6,627,366 B2 | 9/2003 | Yang |
| 6,677,089 B2 | 1/2004 | Ogino et al. |
| 6,803,589 B2 | 10/2004 | Nakasugi |
| 6,891,175 B2 | 5/2005 | Hiura |
| 6,982,135 B2 | 1/2006 | Chang et al. |
| 7,150,949 B2 | 12/2006 | Askebjer et al. |
| 7,269,819 B2 | 9/2007 | Hoshino |
| 7,420,164 B2 | 9/2008 | Nakasuji et al. |
| 7,449,700 B2 | 11/2008 | Inanami |
| 7,498,591 B2 | 3/2009 | Lozes et al. |
| 7,504,645 B2 | 3/2009 | Anpo et al. |
| 7,536,664 B2 | 5/2009 | Cohn et al. |
| 7,592,611 B2 | 9/2009 | Kasahara et al. |
| 7,598,005 B2 | 10/2009 | Yamamoto |
| 7,703,069 B1 | 4/2010 | Liu et al. |
| 7,716,627 B1 | 5/2010 | Ungar et al. |
| 7,754,401 B2 | 7/2010 | Fujimura et al. |
| 7,759,026 B2 | 7/2010 | Fujimura et al. |
| 7,759,027 B2 | 7/2010 | Fujimura et al. |
| 7,824,828 B2 | 11/2010 | Fujimura et al. |
| 7,901,850 B2 | 3/2011 | Fujimura et al. |
| 7,902,528 B2 | 3/2011 | Hara et al. |
| 7,981,575 B2 | 7/2011 | Fujimura et al. |
| 8,017,288 B2 | 9/2011 | Fujimura et al. |
| 8,017,289 B2 | 9/2011 | Fujimura et al. |
| 8,057,970 B2 | 11/2011 | Fujimura et al. |
| 8,137,871 B2 | 3/2012 | Zable et al. |
| 8,202,672 B2 | 6/2012 | Fujimura et al. |
| 8,202,673 B2 | 6/2012 | Fujimura et al. |
| 8,304,148 B2 | 11/2012 | Fujimura et al. |
| 8,354,207 B2 | 1/2013 | Fujimura et al. |
| 8,473,875 B2 | 6/2013 | Fujimura et al. |
| 8,501,374 B2 | 8/2013 | Fujimura et al. |
| 8,609,306 B2 | 12/2013 | Fujimura et al. |
| 8,828,628 B2 | 9/2014 | Fujimura |
| 8,900,778 B2 | 12/2014 | Fujimura et al. |
| 2001/0028981 A1 | 10/2001 | Okada et al. |
| 2002/0005494 A1 | 1/2002 | Kamijo et al. |
| 2002/0020824 A1 | 2/2002 | Itoh |
| 2002/0036273 A1 | 3/2002 | Okino |
| 2002/0125444 A1 | 9/2002 | Kojima |
| 2002/0129328 A1 | 9/2002 | Komatsuda |
| 2003/0043358 A1 | 3/2003 | Suganuma et al. |
| 2003/0044703 A1 | 3/2003 | Yamada |
| 2003/0077530 A1 | 4/2003 | Fujiwara et al. |
| 2003/0082461 A1 | 5/2003 | Carpi |
| 2003/0087191 A1 | 5/2003 | Lavallee et al. |
| 2003/0159125 A1 | 8/2003 | Wang et al. |
| 2003/0203287 A1 | 10/2003 | Miyagawa |
| 2004/0011966 A1 | 1/2004 | Sasaki et al. |
| 2004/0099636 A1 | 5/2004 | Scipioni |
| 2004/0131977 A1 | 7/2004 | Martyniuk et al. |
| 2004/0229133 A1 | 11/2004 | Socha et al. |
| 2005/0053850 A1 | 3/2005 | Askebjer et al. |
| 2005/0211921 A1 | 9/2005 | Wieland et al. |
| 2005/0221204 A1 | 10/2005 | Kimura |
| 2005/0263715 A1 | 12/2005 | Nakasuji et al. |
| 2006/0073686 A1 | 4/2006 | Zach et al. |
| 2006/0085773 A1 | 4/2006 | Zhang |
| 2006/0218520 A1 | 9/2006 | Pierrat et al. |
| 2007/0114453 A1 | 5/2007 | Emi |
| 2007/0114463 A1 | 5/2007 | Nakasugi et al. |
| 2007/0187624 A1 | 8/2007 | Suzuki et al. |
| 2007/0196768 A1 | 8/2007 | Ogino |
| 2007/0280526 A1 | 12/2007 | Malik et al. |
| 2008/0050676 A1 | 2/2008 | Hoshino |
| 2008/0054196 A1 | 3/2008 | Hiroshima |
| 2008/0116397 A1 | 5/2008 | Yoshida et al. |
| 2008/0116398 A1 | 5/2008 | Hara et al. |
| 2008/0116399 A1 | 5/2008 | Fujimura |
| 2008/0118852 A1 | 5/2008 | Mitsuhashi |
| 2008/0128637 A1 | 6/2008 | Yoshida |
| 2008/0203324 A1 | 8/2008 | Fujimura et al. |
| 2009/0200495 A1 | 8/2009 | Platzgummer |
| 2009/0297958 A1 | 12/2009 | Lee et al. |
| 2009/0306805 A1 | 12/2009 | Kyoh |
| 2009/0325085 A1 | 12/2009 | Yoshida et al. |
| 2010/0055580 A1 | 3/2010 | Fujimura et al. |
| 2010/0055581 A1 | 3/2010 | Fujimura et al. |
| 2010/0055585 A1 | 3/2010 | Fujimura et al. |
| 2010/0055586 A1 | 3/2010 | Fujimura et al. |
| 2010/0058279 A1 | 3/2010 | Fujimura et al. |
| 2010/0058281 A1 | 3/2010 | Fujimura et al. |
| 2010/0058282 A1 | 3/2010 | Fujimura et al. |
| 2010/0148087 A1 | 6/2010 | Doering et al. |
| 2010/0183963 A1 | 7/2010 | Zable et al. |
| 2010/0251202 A1 | 9/2010 | Pierrat |
| 2010/0264335 A1 | 10/2010 | Hoyle et al. |
| 2010/0315611 A1 | 12/2010 | Kato |
| 2010/0325595 A1 | 12/2010 | Song et al. |
| 2011/0033788 A1 | 2/2011 | Kato |
| 2011/0053056 A1 | 3/2011 | Fujimura et al. |
| 2011/0053093 A1 | 3/2011 | Hagiwara et al. |
| 2011/0089344 A1 | 4/2011 | Fujimura et al. |
| 2011/0116067 A1 | 5/2011 | Ye et al. |
| 2011/0145769 A1 | 6/2011 | Wei |
| 2011/0159435 A1 | 6/2011 | Zable et al. |
| 2011/0177458 A1 | 7/2011 | Kotani et al. |
| 2012/0047474 A1 | 2/2012 | Choi et al. |
| 2012/0096412 A1 | 4/2012 | Fujimura et al. |
| 2012/0149133 A1 | 6/2012 | Parrish et al. |
| 2012/0151428 A1 | 6/2012 | Tanaka et al. |
| 2012/0217421 A1 | 8/2012 | Fujimura et al. |
| 2012/0219886 A1 | 8/2012 | Fujimura et al. |
| 2012/0221980 A1 | 8/2012 | Fujimura et al. |
| 2012/0221985 A1 | 8/2012 | Fujimura |
| 2012/0329289 A1 | 12/2012 | Fujimura et al. |
| 2013/0070222 A1 | 3/2013 | Fujimura |
| 2013/0283218 A1 | 10/2013 | Fujimura et al. |
| 2015/0082258 A1 | 3/2015 | Fujimura et al. |

FOREIGN PATENT DOCUMENTS

| | | | |
|---|---|---|---|
| EP | 2302659 | A2 | 3/2011 |
| GB | 2367908 | | 4/2002 |
| JP | S5425675 | A | 2/1979 |
| JP | S54025675 | | 2/1979 |
| JP | S608844 | A | 1/1985 |
| JP | 61105839 | | 5/1986 |
| JP | 63007631 | | 1/1988 |
| JP | H02280315 | A | 11/1990 |
| JP | 03205815 | | 9/1991 |
| JP | H03205815 | A | 9/1991 |
| JP | 04058518 | | 2/1992 |
| JP | 04096065 | | 3/1992 |
| JP | 1992155337 | | 5/1992 |
| JP | 04196516 | | 7/1992 |
| JP | 4196516 | A | 7/1992 |
| JP | H04196516 | A | 7/1992 |
| JP | H04307723 | A | 10/1992 |
| JP | 05036595 | | 2/1993 |
| JP | H0536595 | A | 2/1993 |
| JP | H05036595 | | 2/1993 |
| JP | 05114549 | | 5/1993 |

(56) References Cited

FOREIGN PATENT DOCUMENTS

| | | |
|---|---|---|
| JP | 05198483 | 8/1993 |
| JP | 05267132 | 10/1993 |
| JP | 05267133 | 10/1993 |
| JP | H05267133 A | 10/1993 |
| JP | H05335221 A | 12/1993 |
| JP | H0620931 A | 1/1994 |
| JP | H06020931 | 1/1994 |
| JP | 06124883 | 5/1994 |
| JP | 06252036 | 9/1994 |
| JP | 08055771 | 2/1996 |
| JP | 8555771 | 2/1996 |
| JP | H0855771 A | 2/1996 |
| JP | 08064522 | 3/1996 |
| JP | H08195339 A | 7/1996 |
| JP | 8222504 | 8/1996 |
| JP | H08222504 A | 8/1996 |
| JP | H09266153 A | 10/1997 |
| JP | 10294255 | 11/1998 |
| JP | H11111594 A | 4/1999 |
| JP | 11233401 | 8/1999 |
| JP | 2000012426 A | 1/2000 |
| JP | 200066366 A | 3/2000 |
| JP | 2000066366 A | 3/2000 |
| JP | 2000091191 A | 3/2000 |
| JP | 2000123768 A | 4/2000 |
| JP | 2000138165 A | 5/2000 |
| JP | 2000269123 A | 9/2000 |
| JP | 2001013671 A | 1/2001 |
| JP | 2001093809 A | 4/2001 |
| JP | 2001203157 A | 7/2001 |
| JP | 2001230203 A | 8/2001 |
| JP | 2001305720 A | 11/2001 |
| JP | 2001313253 A | 11/2001 |
| JP | 2002008966 | 1/2002 |
| JP | 2002075830 A | 3/2002 |
| JP | 2002110508 A | 4/2002 |
| JP | 2002202590 A | 7/2002 |
| JP | 2002217092 A | 8/2002 |
| JP | 2002351055 A | 12/2002 |
| JP | 2003195511 A | 7/2003 |
| JP | 2003315976 A | 11/2003 |
| JP | 2003338460 A | 11/2003 |
| JP | 2003347192 A | 12/2003 |
| JP | 2004088071 A | 3/2004 |
| JP | 2004134447 A | 4/2004 |
| JP | 2004134574 A | 4/2004 |
| JP | 2004170410 A | 6/2004 |
| JP | 2004273526 A | 9/2004 |
| JP | 2004304031 A | 10/2004 |
| JP | 2004356440 A | 12/2004 |
| JP | 2005079111 A | 3/2005 |
| JP | 2006032814 A | 2/2006 |
| JP | 2006059348 A | 3/2006 |
| JP | 2006100336 A | 4/2006 |
| JP | 2006100409 A | 4/2006 |
| JP | 2006108447 A | 4/2006 |
| JP | 2006222230 A | 8/2006 |
| JP | 2006294794 A | 10/2006 |
| JP | 2007041090 A | 2/2007 |
| JP | 2007103923 A | 4/2007 |
| JP | 2007242710 A | 9/2007 |
| JP | 2007249167 | 9/2007 |
| JP | 2007305880 A | 11/2007 |
| JP | 2008053565 A | 3/2008 |
| JP | 2008066441 A | 3/2008 |
| JP | 2008096486 A | 4/2008 |
| JP | 2009147254 A | 7/2009 |
| JP | 2010062562 A | 3/2010 |
| JP | 2011040716 A | 2/2011 |
| KR | 1020070082031 | 8/2007 |
| KR | 1020080001438 A | 1/2008 |
| TW | 495834 B | 7/2002 |
| TW | I222100 B | 10/2004 |
| TW | I233149 B | 5/2005 |
| TW | 200523524 A | 7/2005 |
| TW | 200604763 A | 2/2006 |
| TW | 200606602 | 2/2006 |
| TW | 200700932 | 1/2007 |
| TW | 200832080 A | 8/2008 |
| TW | 200834366 A | 8/2008 |
| TW | 200900880 A | 1/2009 |
| WO | 03036386 A | 5/2003 |
| WO | 2004077156 A | 9/2004 |
| WO | 2007030528 A2 | 3/2007 |
| WO | 2008064155 A | 5/2008 |
| WO | 2010025031 A2 | 3/2010 |
| WO | 2010025060 A2 | 3/2010 |

OTHER PUBLICATIONS

Office Action Dated Jan. 16, 2013 for U.S. Appl. No. 13/037,268.
Office Action dated Jan. 20, 2015 for Japanese Patent Application No. 2012-535223.
Office Action dated Jan. 25, 2013 for U.S. Appl. No. 13/329,314.
Office Action dated Jan. 6, 2015 for Japanese Patent Application No. 2010-183857.
Office Action dated Jul. 15, 2014 for U.S. Appl. No. 13/037,270.
Office Action dated Jul. 23, 2013 for Japanese Patent Application No. 2009-200191.
Office Action dated Jul. 23, 2013 for Japanese Patent Application No. 2011-525072.
Office Action dated Jul. 8, 2014 for Japanese Patent Application No. 2009-200191.
Office Action dated Jul. 8, 2015 for U.S. Appl. No. 14/479,520.
Office Action dated Jun. 3, 2014 for Japanese Patent Application No. 2012-526931.
Office Action dated Jun. 10, 2014 for Japanese Patent Application No. 2011-525090.
Office Action dated Jun. 10, 2014 for JP Patent Application No. 2011-525073.
Office Action dated Jun. 15, 2015 for U.S. Appl. No. 14/578,410.
Office Action dated Jun. 19, 2015 for U.S. Appl. No. 13/862,471.
Office Action dated Jun. 22, 2012 for U.S. Appl. No. 13/037,268.
Office Action dated Jun. 25, 2015 for U.S. Appl. No. 14/552,360.
Office Action dated Jun. 3, 2014 for Japanese Patent Application No. 2012-535220.
Office Action dated Jun. 6, 2014 for U.S. Appl. No. 13/329,315.
Office Action dated Mar. 11, 2014 for U.S. Appl. No. 13/959,530.
Office Action dated Mar. 13, 2014 for U.S. Appl. No. 13/862,476.
Office Action dated Mar. 18, 2011 for U.S. Appl. No. 12/540,321.
Office Action dated Mar. 2, 2011 for U.S. Appl. No. 12/987,994.
Office Action dated Mar. 22, 2013 for U.S. Appl. No. 13/710,426.
Office Action dated Mar. 27, 2015 for U.S. Appl. No. 14/454,140.
Office Action dated Mar. 3, 2015 for Japanese Patent Application No. 2011-525090.
Office Action dated Mar. 31, 2011 for U.S. Appl. No. 12/540,328.
Office Action dated Mar. 31, 2011 for U.S. Appl. No. 12/750,709.
Office Action dated May 9, 2014 for U.S. Appl. No. 14/106,584.
Office Action dated May 1, 2014 for U.S. Appl. No. 13/862,471.
Office Action dated May 12, 2015 for Korean Patent Application No. 10-2014-7036547.
Office Action dated May 13, 2014 for Japanese Patent Application No. 2010-183857.
Office Action dated May 16, 2014 for U.S. Appl. No. 13/948,725.
Office Action dated May 17, 2012 for U.S. Appl. No. 13/037,270.
Office Action dated May 24, 2013 for U.S. Appl. No. 13/329,315.
Office Action dated May 27, 2014 for Japanese Patent Application No. 2012-535223.
Office Action dated May 5, 2014 for U.S. Appl. No. 13/862,475.
Office Action Dated Nov. 5, 2012 for U.S. Appl. No. 13/037,270.
Office Action dated Nov. 11, 2014 for Japanese Patent Application No. 2012-526931.
Office action dated Nov. 24, 2009 for U.S. Appl. No. 12/269,777, mailed Nov. 24, 2009.
Office Action dated Oct. 15, 2014 for U.S. Appl. No. 13/862,476.
Office Action dated Oct. 20, 2014 for U.S. Appl. No. 13/862,471.
Office Action dated Oct. 24, 2014 for U.S. Appl. No. 14/106,584.
Office Action dated Oct. 25, 2013 for U.S. Appl. No. 13/037,263.
Office Action dated Oct. 29, 2013 for U.S. Appl. No. 13/037,270.

(56) References Cited

OTHER PUBLICATIONS

Office Action dated Oct. 6, 2014 for U.S. Appl. No. 14/331,008.
Office Action dated Sep. 10, 2013 for U.S. Appl. No. 13/329,314.
Office Action dated Sep. 24, 2013 for U.S. Appl. No. 13/329,315.
Office action filed on Mar. 17, 2011 for U.S. Appl. No. 12/540,322.
Office Action filed on Mar. 18, 2011 for U.S. Appl. No. 12/540,321.
Extended European Search Report dated Jul. 20, 2015 for European Patent Application No. 12833285.5.
Extended European Search Report dated Jul. 23, 2015 for European Patent Application No. 12804558.0.
Hagiwara et al., Model-Based Mask Data Preparation (MB-MDP) for ArF and EUV Mask Process Correction, Photomask and Next-Generation Lithography Mask Technology XVIII, SPIE, vol. 8081, No. 1, Apr. 2011, pp. 1-8.
Office Action dated Aug. 18, 2015 for Japanese Patent Application No. 2014-248818.
Office Action dated Aug. 20, 2015 for U.S. Appl. No. 13/862,475.
Office Action dated Jul. 27, 2015 for U.S. Appl. No. 14/331,008.
Office Action dated Oct. 6, 2015 for Japanese Patent Application No. 2013-556643.
Office Action dated Sep. 11, 2015 for U.S. Appl. No. 14/739,989.
Office Action dated Sep. 11, 2015 for U.S. Appl. No. 14/177,688.
Office Action dated Sep. 15, 2015 for Japanese Patent Application No. 2014-245829.
Office Action dated Sep. 21, 2015 for U.S. Appl. No. 14/177,679.
Office Action dated Sep. 29, 2015 for U.S. Appl. No. 14/715,136.
Pierrat et al, Mask Data Correction Methodology in the Context of Model-Based Fracturing and Advanced Mask Models, Optical Microlithography XXIV, SPIE, vol. 7973, No. 1, Mar. 2011, pp. 1-11.
European Search Report dated Nov. 17, 2015 for EP Patent Application No. 09810441.7.
Notice of Allowance and Fees dated Oct. 14, 2015 for U.S. Appl. No. 14/552,360.
Notice of Allowance dated Dec. 24, 2015 for U.S. Appl. No. 14/177,679.
Notice of Allowance dated Oct. 23, 2015 for U.S. Appl. No. 14/479,520.
Office Action dated Dec. 16, 2015 for Republic of Korea Patent Application No. 10-2011-7007511.
Office Action dated Dec. 21, 2015 for Republic of Korea Patent Application No. 10-2014-7036547.
Office Action dated Oct. 20, 2015 for U.S. Appl. No. 14/454,140.
Official Letter and Search Report dated Oct. 21, 2015 for Taiwanese Patent Application 101122222.
Quickle et al., Spot Overlap in a Variable Shaped Shpot Electroni Beam Exposure Tool, IP.com Journal, IP.Com Inc., West Henrietta, NY, USA, Jun. 1, 1981 pp. 1-3.
Sakakibara et al., Variable-shaped Electron-Beam Direct Writing Technology for 1-Mum VSI Fabrication, IEEE Transations on Electron Devices, IEEE Service Center, New Jersey, US, vol. 28, No. 11, Nov. 1, 1981, pp. 1279-1284.
Office Action filed on Mar. 2, 2011 for U.S. Appl. No. 12/987,994.
Official Letter and Search Report dated Apr. 10, 2015 for Taiwanese Patent Application No. 98128034.
Official Letter and Search Report dated Apr. 13, 2015 for Taiwanese Patent Application No. TW 100136720.
Official letter and search report dated Apr. 29, 2015 for Taiwanese Application No. 99127100.
Official Letter and Search Report dated Aug. 21, 2014 for Taiwanese Patent Application No. 098128359.
Official letter and search report dated Aug. 6, 2014 for Taiwanese Patent Application No. 099127553.
Official Letter and Search Report dated Oct. 24, 2014 for Taiwanese Patent Application No. 099134187.
Official Letter and Search Report dated Sep. 25, 2014 for Taiwanese Patent Application No. 099134186.
Official Letter and Search Report dated Sep. 25, 2014 for Taiwanese Patent Application No. 98128360.
Pierrat and Bork, "Impact of Model-Based Fracturing on E-beam Proximity Effect Correction Methodology", Sep. 29, 2010, Proc. of SPIE, vol. 7823, pp. 782313-1-782313-11, Photomask Technology 2010.
Search Report dated Apr. 9, 2014 for Taiwanese Application No. 98128358.
Yamada and Yabe, "Variable cell projection as an advance in electron-beam cell projection system", J. Vac. Sci. Technol. B, vol. 22, No. 6, Nov./Dec. 2004, pp. 2917-2922.
Bloecker, M. et al., "Metrics to Assess Fracture Quality for Variable Shaped Beam Lithography", Proceedings of SPIE, vol. 6349 (Oct. 2006), pp. 63490Z-1-63490Z-10, SPIE, P.O. Box 10, Bellingham, WA. 98227, U.S.A.
Chinese Office Action dated Jan. 14, 2013 for Chinese Application No. 200980134188.6.
Chinese Office Action dated Sep. 11, 2013 for Chinese Application No. 200980134188.6.
International Preliminary Report on Patentability and Written Opinion dated Mar. 10, 2011 for PCT Application No. PCT/US2009/053327.
International Preliminary Report on Patentability and Written Opinion dated Mar. 10, 2011 for PCT Patent Application No. PCT/US2009/053328.
International Preliminary Report on Patentability and Written Opinion dated Mar. 10, 2011 for PCT Patent Application No. PCT/US2009/054239.
International Preliminary Report on Patentability and Written Opinion dated Mar. 10, 2011 for PCT Patent Application No. PCT/US2009/054229.
International Search Report and Written Opinion dated Mar. 2, 2013 for PCT Application No. PCT/US2009/053327.
International Search Report and Written Opinion dated Oct. 18, 2012 for PCT Patent Application No. PCT/US2012/025149.
International Search Report and Written Opinion dated Oct. 23, 2012 for PCT Application No. PCT/US2012/025148.
International Search Report and Written Opinion dated Sep. 17, 2012 for PCT Application No. PCT/US2012/025328.
Japanese Office Action dated Aug. 20, 2013 for Japanese Patent Application No. 2011-525073.
Japanese Office Action dated Oct. 1, 2013 for Japanese Patent Application No. 2011-525090.
Japanese Office Action dated Oct. 8, 2013 for Japanese Patent Application No. 2011-525091.
Martin, L. et al., "Development of Multiple Pass Exposure in Electron Beam Direct Write Lithography for Sub-32nm Nodes", Proceedings of SPIE, vol. 7488 (Sep. 29, 2009), pp. 74881C-1-74881C-12, SPIE, P.O. Box 10, Bellingham, WA. 98227, U.S.A.
Martin, L. et al., "New Writing Strategy in Electron Beam Direct Write Lithography to Improve Critical Dense Lines Patterning for Sub-45nm Nodes", Proceedings of SPIE, vol. 7470 (Jan. 29, 2009), pp. 74700R-1-74700R-12, SPIE, P.O. Box 10, Bellingham, WA. 98227, U.S.A.
Notice of Allowance and Fee(s) dated Oct. 11, 2013 for U.S. Appl. No. 13/923,368.
Notice of Allowance and Fee(s) due dated Apr. 5, 2011 for U.S. Appl. No. 12/473,248.
Notice of Allowance and Fee(s) due filed on Jan. 20, 2011 for U.S. Appl. No. 12/473,265.
Notice of Allowance and Fees dated Aug. 1, 2014 for U.S. Appl. No. 14/108,135.
Notice of Allowance and Fees dated Aug. 15, 2014 for U.S. Appl. No. 13/959,530.
Notice of Allowance and Fees dated Aug. 2, 2013 for U.S. Appl. No. 13/710,426.
Notice of Allowance and Fees dated Aug. 23, 2013 for U.S. Appl. No. 13/723,181.
Notice of Allowance and Fees dated Dec. 26, 2013 for U.S. Appl. No. 13/862,472.
Notice of Allowance and Fees dated Feb. 9, 2015 for U.S. Appl. No. 13/037,270.
Notice of Allowance and Fees dated Jan. 21, 2015 for U.S. Appl. No. 14/257,874.

(56) References Cited

OTHER PUBLICATIONS

Notice of Allowance and Fees dated Jan. 23, 2015 for U.S. Appl. No. 13/862,476.
Notice of Allowance and Fees dated Jan. 26, 2015 for U.S. Appl. No. 14/106,584.
Notice of Allowance and Fees dated Jul. 23, 2014 for U.S. Appl. No. 13/970,465.
Notice of Allowance and Fees dated Jun. 23, 2015 for U.S. Appl. No. 14/578,060.
Notice of Allowance and Fees dated Mar. 20, 2014 for U.S. Appl. No. 13/970,465.
Notice of Allowance and Fees dated Mar. 27, 2015 for U.S. Appl. No. 13/948,725.
Notice of Allowance and Fees dated Oct. 10, 2014 for U.S. Appl. No. 13/801,554.
Notice of Allowance and Fees Dues dated Apr. 5, 2011 for U.S. Appl. No. 12/473,248.
Notice of Allowance dated Mar. 22, 2011 for U.S. Appl. No. 12/603,580.
Notice of Allowance dated Oct. 29, 2010 for U.S. Appl. No. 12/202,365.
Notice of Allowance dated Mar. 26, 2013 for U.S. Appl. No. 13/650,618.
Office Action dated Mar. 24, 2011 for U.S. Appl. No. 12/618,722.
Office Action dated Dec. 14, 2010 for U.S. Appl. No. 12/473,248.
Office Action dated Dec. 14, 2010 for U.S. Appl. No. 12/473,265.
Office Action dated Apr. 15, 2014 for Japanese Patent Application No. 2011-525072.
Office Action dated Apr. 3, 2014 for Chinese patent application No. 200980134188.6.
Office Action dated Apr. 8, 2014 for Japanese Patent Application No. 2011-525091.
Office Action dated Aug. 16, 2012 for U.S. Appl. No. 13/329,315.
Office Action dated Aug. 5, 2014 for Japanese Patent Application No. 2011-525091.
Office Action dated Dec. 16, 2014 for U.S. Appl. No. 13/948,725.
Office Action dated Feb. 14, 2014 for U.S. Appl. No. 13/631,941.
Office Action dated Feb. 27, 2014 for U.S. Appl. No. 13/236,610.

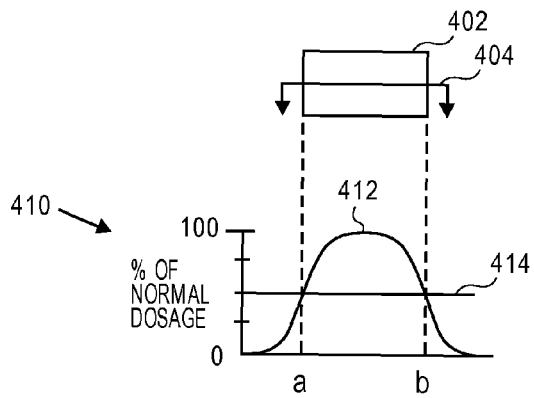
FIG. 4A
FIG. 4B
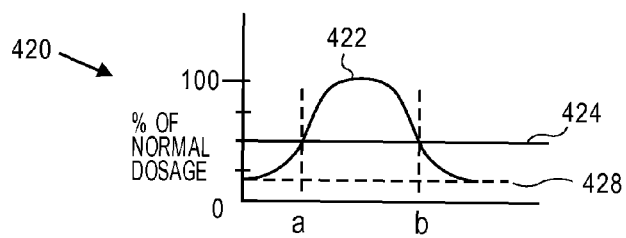
FIG. 4C
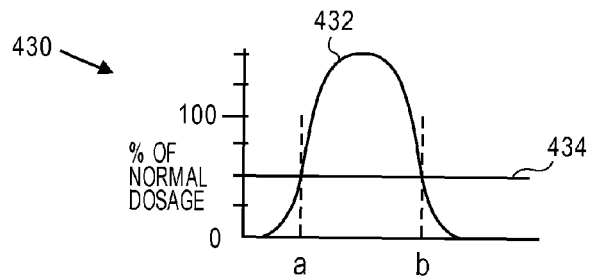
FIG. 4D
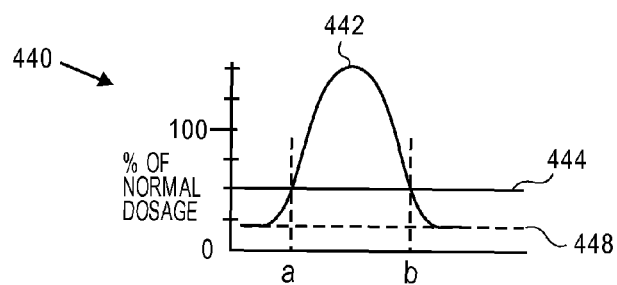
FIG. 4E
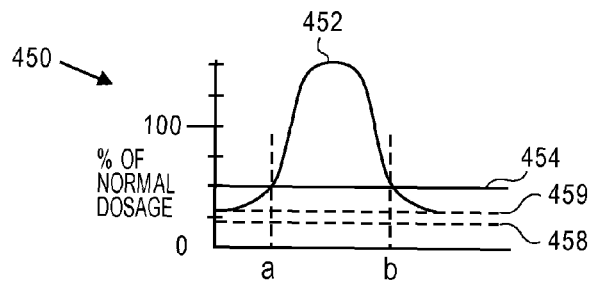
FIG. 4F

METHOD AND SYSTEM FOR FORMING PATTERNS USING CHARGED PARTICLE BEAM LITHOGRAPHY WITH VARIABLE PATTERN DOSAGE

RELATED APPLICATIONS

This application: 1) is a continuation of U.S. patent application Ser. No. 13/329,315 filed on Dec. 18, 2011 entitled "Method and System for Forming Patterns Using Charged Particle Beam Lithography with Variable Pattern Dosage"; 2) which is a continuation-in-part of U.S. patent application Ser. No. 13/037,263 filed on Feb. 28, 2011 entitled "Method And System For Design Of A Surface To Be Manufactured Using Charged Particle Beam Lithography". This application is related to U.S. patent application Ser. No. 13/037,268 filed on Feb. 28, 2011 entitled "Method And System For Design Of Enhanced Accuracy Patterns For Charged Particle Beam Lithography"; and is related to U.S. patent application Ser. No. 13/329,314 filed on Dec. 18, 2011, entitled "Method and System For Forming Patterns Using Charged Particle Beam Lithography With Overlapping Shots", all of which are hereby incorporated by reference for all purposes.

This application also 3) is a continuation-in-part of U.S. patent application Ser. No. 14/552,360 filed on Nov. 24, 2014 entitled "Method for Forming Circular Patterns on a Surface"; 4) which is a continuation of U.S. patent application Ser. No. 14/108,135 filed on Dec. 16, 2013, entitled "Method For Forming Circular Patterns On A Surface" and issued as U.S. Pat. No. 8,900,778; 5) which is a continuation of U.S. patent application Ser. No. 13/723,181 filed on Dec. 20, 2012, entitled "Method For Forming Circular Patterns On A Surface" and issued as U.S. Pat. No. 8,609,306, all of which are hereby incorporated by reference. U.S. patent application Ser. No. 13/723,181 is 6) a continuation of U.S. patent application Ser. No. 13/282,446 filed on Oct. 26, 2011 entitled "Method, Device, And System For Forming Circular Patterns On A Surface" and issued as U.S. Pat. No. 8,354,207; 7) which is a continuation of U.S. patent application Ser. No. 12/540,322 filed on Aug. 12, 2009 entitled "Method and System For Forming Circular Patterns On a Surface" and issued as U.S. Pat. No. 8,057,970, both of which are hereby incorporated by reference for all purposes.

U.S. patent application Ser. No. 12/540,322: 8) is a continuation-in-part of U.S. patent application Ser. No. 12/202,364 filed Sep. 1, 2008, entitled "Method and System For Manufacturing a Reticle Using Character Projection Particle Beam Lithography" and issued as U.S. Pat. No. 7,759,026; 9) is a continuation-in-part of U.S. patent application Ser. No. 12/473,241 filed May 27, 2009, entitled "Method for Manufacturing a Surface and Integrated Circuit Using Variable Shaped Beam Lithography" and issued as U.S. Pat. No. 7,754,401; 10) claims priority from U.S. Provisional Patent Application Ser. No. 61/224,849 filed Jul. 10, 2009, entitled "Method and System for Manufacturing Circular Patterns On a Surface And Integrated Circuit"; and is related to U.S. patent application Ser. No. 12/540,321 filed Aug. 12, 2009, entitled "Method For Fracturing Circular Patterns and For Manufacturing a Semiconductor Device" and issued as U.S. Pat. No. 8,017,288; all of which are hereby incorporated by reference for all purposes.

BACKGROUND OF THE DISCLOSURE

The present disclosure is related to lithography, and more particularly to the design and manufacture of a surface which may be a reticle, a wafer, or any other surface, using charged particle beam lithography.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays, holographic masks or even other reticles. While conventional optical lithography uses a light source having a wavelength of 193 nm, extreme ultraviolet (EUV) or X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nanoimprint lithography, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Also, some patterns of a given layer may be written using optical lithography, and other patterns written using maskless direct write. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms, or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on an interior or exterior corner of a pattern to sharpen the corner in the final transferred image. It is often the case that the precision demanded of the surface manufacturing process for SRAFs is less than the precision demanded for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of designed features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a designed feature size. Note that for clarity, variations in the design of the OPC are what is being referenced. Manufacturing variations such as corner rounding will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a designed feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the designed features on the mask. As process nodes continue to shrink, the size of the smallest SRAFs on a photomask also shrinks For example, at the 20 nm logic process node, 40 nm to 60 nm SRAFs are needed on the mask for the highest precision layers.

Inverse lithography technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the substrate as input. ILT-computed reticle patterns may be purely curvilinear—i.e. completely non-rectilinear—and may include circular, nearly circular, annular, nearly annular, oval and/or nearly oval patterns. Since these ideal ILT curvilinear patterns are difficult and expensive to form on a reticle using conventional techniques, rectilinear approximations or rectilinearizations of the curvilinear patterns may be used. The rectilinear approximations decrease accuracy, however, compared to the ideal ILT curvilinear patterns. Additionally, if the rectilinear approximations are produced from the ideal ILT curvilinear patterns, the overall calculation time is increased compared to ideal ILT curvilinear patterns. In this disclosure ILT, OPC, source mask optimization (SMO), and computational lithography are terms that are used interchangeably.

There are a number of technologies used for forming patterns on a reticle, including using optical lithography or charged particle beam lithography. The most commonly used system is the variable shaped beam (VSB), where, as described above, doses of electrons with simple shapes such as manhattan rectangles and 45-degree right triangles expose a resist-coated reticle surface. In conventional mask writing, the doses or shots of electrons are conventionally designed to avoid overlap wherever possible, so as to greatly simplify calculation of how the resist on the reticle will register the pattern. Similarly, the set of shots is designed so as to completely cover the pattern area that is to be formed on the reticle. U.S. Pat. No. 7,754,401, owned by the assignee of the present patent application and incorporated by reference for all purposes, discloses a method of mask writing in which intentional shot overlap for writing patterns is used. When overlapping shots are used, charged particle beam simulation can be used to determine the pattern that the resist on the reticle will register. Use of overlapping shots may allow patterns to be written with reduced shot count. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401.

Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce over-heating of the resist coating the surface. Multi-pass writing also averages out random errors of the charged particle beam writer. Multi-pass writing using different shot lists for different exposure passes can also reduce the effects of certain systemic errors in the writing process.

In EUV lithography, OPC features are generally not required. Therefore, the complexity of the pattern to be manufactured on the reticle is less than with conventional 193 nm wavelength optical lithography, and shot count reduction is correspondingly less important. In EUV, however, mask accuracy requirements are very high because the patterns on the mask, which are typically 4× the size of the patterns on the wafer, are sufficiently small that they are challenging to form precisely using charged particle beam technology such as electron beam.

SUMMARY OF THE DISCLOSURE

A method and system for fracturing or mask data preparation or optical proximity correction or proximity effect correction or mask process correction is disclosed in which a set of shaped beam shots is determined that is capable of forming a pattern on a surface, where the set of shots provides different dosages to different parts of the pattern, and where the dose margin from the set of shots is calculated.

A method for forming patterns on a surface is also disclosed, in which a set of shaped beam shots is determined that is capable of forming a pattern on a surface, where the set of shots provides different dosages to different parts of the pattern, and where the dose margin from the set of shots is calculated.

BRIEF DESCRIPTION OF THE DRAWINGS

FIG. 4A illustrates an example of a shot outline from a rectangular shot;

FIG. 4B illustrates an example of a longitudinal dosage curve for the shot of FIG. 4A using a normal shot dosage;

FIG. 4C illustrates an example of a longitudinal dosage curve similar to FIG. 4B, with long-range effects included;

FIG. 4D illustrates an example of a longitudinal dosage curve for the shot of FIG. 4A using a higher than normal shot dosage;

FIG. 4E illustrates an example of a longitudinal dosage curve similar to FIG. 4D, with long-range effects included;

FIG. 4F illustrates an example of a longitudinal dosage curve similar to FIG. 4E, but with a higher background dosage level;

DETAILED DESCRIPTION OF THE EMBODIMENTS

The present disclosure describes a method for fracturing patterns into shots for a charged particle beam writer, where overlapping shots are generated to improve the accuracy and/or the dose margin of the pattern written to a surface. The dose margin improvement reduces dimensional changes in the written pattern which are associated with process variations.

Figure 1:
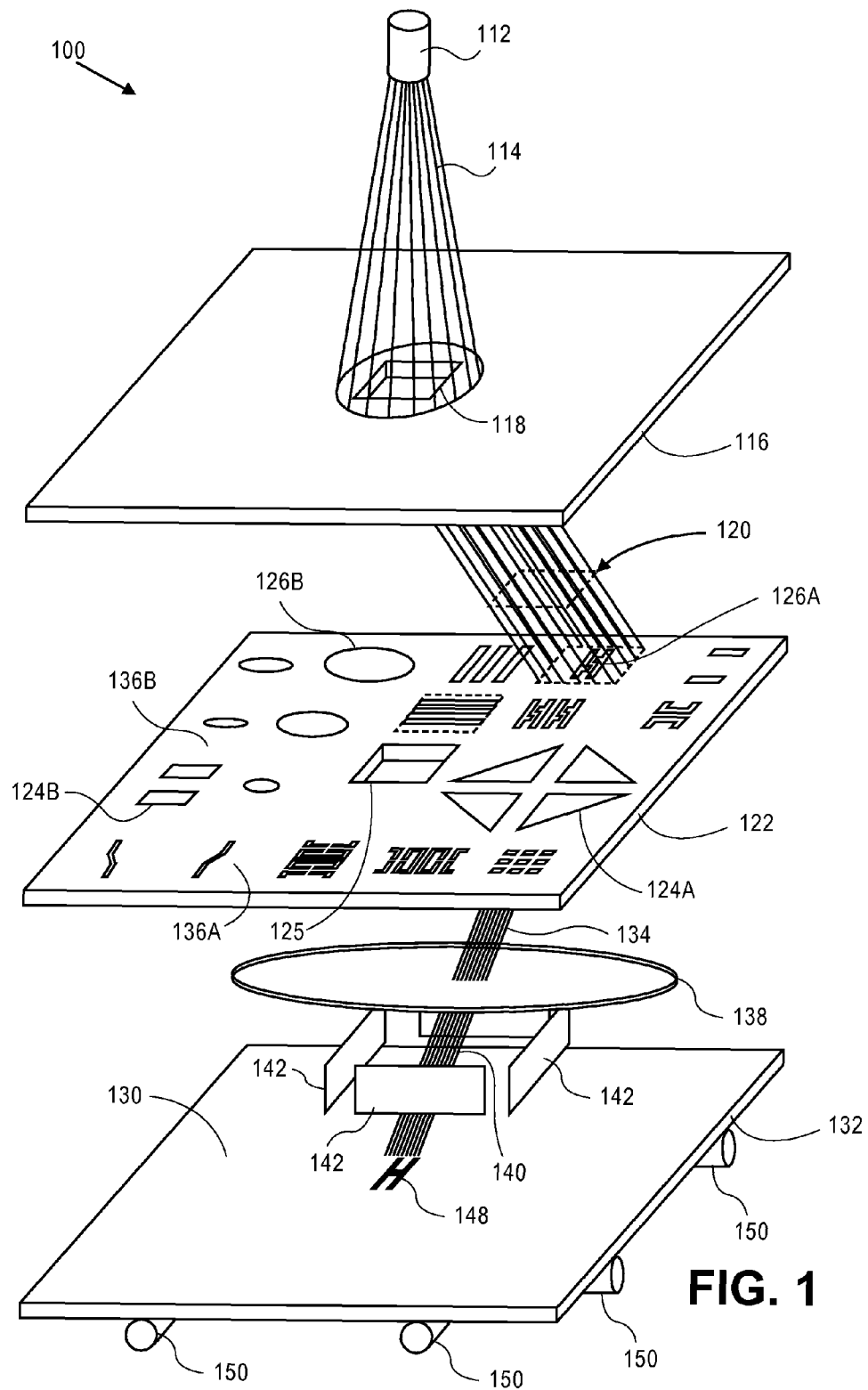
FIG. 1 illustrates an example of a character projection particle beam system.

Referring now to the drawings, wherein like numbers refer to like items, FIG. 1 illustrates an embodiment of a conventional lithography system 100, such as a charged particle beam writer system, in this case an electron beam writer system, that employs character projection to manufacture a surface 130. The electron beam writer system 100 has an electron beam source 112 that projects an electron beam 114 toward an aperture plate 116. The plate 116 has an aperture 118 formed therein which allows the electron beam 114 to pass. Once the electron beam 114 passes through the aperture 118 it is directed or deflected by a system of lenses (not shown) as electron beam 120 toward another rectangular aperture plate or stencil mask 122. The stencil 122 has formed therein a number of openings or apertures 124 that define various types of characters 126, which may be complex characters. Each character 126 formed in the stencil 122 may be used to form a pattern 148 on a surface 130 of a substrate 132, such as a silicon wafer, a reticle or other substrate. In partial exposure, partial projection, partial character projection, or variable character projection, electron beam 120 may be positioned so as to strike or illuminate only a portion of one of the characters 126, thereby forming a pattern 148 that is a subset of character 126. For each character 126 that is smaller than the size of the electron beam 120 defined by aperture 118, a blanking area 136, containing no aperture, is designed to be adjacent to the character 126, so as to prevent the electron beam 120 from illuminating an unwanted character on stencil 122. An electron beam 134 emerges from one of the characters 126 and passes through an electromagnetic or electrostatic reduction lens 138 which reduces the size of the pattern from the character 126. In commonly available charged particle beam writer systems, the reduction factor is between 10 and 60. The reduced electron beam 140 emerges from the reduction lens 138, and is directed by a series of deflectors 142 onto the surface 130 as the pattern 148, which is depicted as being in the shape of the letter "H" corresponding to character 126A. The pattern 148 is reduced in size compared to the character 126A because of the reduction lens 138. The pattern 148 is drawn by using one shot of the electron beam system 100. This reduces the overall writing time to complete the pattern 148 as compared to using a variable shape beam (VSB) projection system or method. Although one aperture 118 is shown being formed in the plate 116, it is possible that there may be more than one aperture in the plate 116. Although two plates 116 and 122 are shown in this example, there may be only one plate or more than two plates, each plate comprising one or more apertures. Stencil mask 122 also contains apertures for VSB shots, such as rectangular aperture 125.

In conventional charged particle beam writer systems the reduction lens 138 is calibrated to provide a fixed reduction factor. The reduction lens 138 and/or the deflectors 142 also focus the beam on the plane of the surface 130. The size of the surface 130 may be significantly larger than the maximum beam deflection capability of the deflection plates 142. Because of this, patterns are normally written on the surface in a series of stripes. Each stripe contains a plurality of sub-fields, where a sub-field is within the beam deflection capability of the deflection plates 142. The electron beam writer system 100 contains a positioning mechanism 150 to allow positioning the substrate 132 for each of the stripes and sub-fields. In one variation of the conventional charged particle beam writer system, the substrate 132 is held stationary while a sub-field is exposed, after which the positioning mechanism 150 moves the substrate 132 to the next sub-field position. In another variation of the conventional charged particle beam writer system, the substrate 132 moves continuously during the writing process. In this variation involving continuous movement, in addition to deflection plates 142, there may be another set of deflection plates (not shown) to move the beam at the same speed and direction as the substrate 132 is moved. In one embodiment the substrate 132 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 148, generally reduced in size, onto a silicon wafer to produce an integrated circuit. More generally, the mask is used in another device or machine to transfer the pattern 148 on to a substrate. In another embodiment the substrate 132 may be a silicon wafer.

The minimum size pattern that can be projected with reasonable accuracy onto a surface 130 is limited by a variety of short-range physical effects associated with the electron beam writer system 100 and with the surface 130, which normally comprises a resist coating on the substrate 132. These effects include forward scattering, Coulomb effect, and resist diffusion. Beam blur, also called $\beta_f$, is a term used to include all of these short-range effects. The most modern electron beam writer systems can achieve an effective beam blur radius or $\beta_f$ in the range of 20 nm to 30 nm. Forward scattering may constitute one quarter to one half of the total beam blur. Modern electron beam writer systems contain numerous mechanisms to reduce each of the constituent pieces of beam blur to a minimum. Since some components of beam blur are a function of the calibration level of a particle beam writer, the $\beta_f$ of two particle beam writers of the same design may differ. The diffusion characteristics of resists may also vary. Variation of $\beta_f$ based on shot size or shot dose can be simulated and systemically accounted for. But there are other effects that cannot or are not accounted for, and they appear as random variation.

The shot dosage of a charged particle beam writer such as an electron beam writer system is a function of the intensity of the beam source 112 and the exposure time for each shot. Typically the beam intensity remains fixed, and the exposure time is varied to obtain variable shot dosages. The exposure time may be varied to compensate for various long-range effects such as backscatter and fogging in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots have the base dosage, before PEC. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels. Some embodiments of the current invention are targeted for use with charged particle beam writing systems which allow assignment of one of a relatively few dosage levels.

The mechanisms within electron beam writers have a relatively coarse resolution for calculations. As such, mid-range corrections such as may be required for EUV masks in the range of 2 μm cannot be computed accurately by current electron beam writers.

Figure 2A:
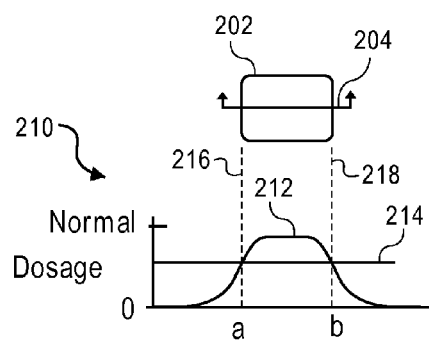
FIG. 2A illustrates an example of a single charged particle beam shot and a cross-sectional dosage graph of the shot.
Figure 2B:
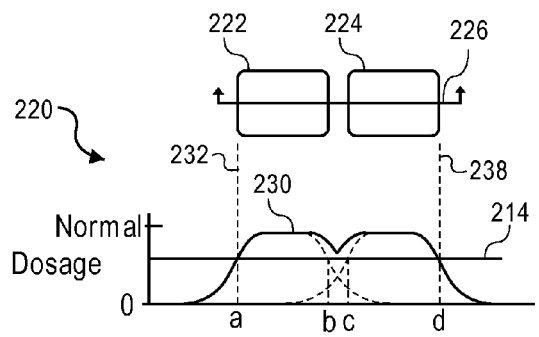
FIG. 2B illustrates an example of a pair of proximate shots and a cross-sectional dosage graph of the shot pair.

FIGS. 2A-B illustrate how energy is registered on a resist-coated surface from one or more charged particle beam shots. In FIG. 2A rectangular pattern 202 illustrates a shot outline, which is a pattern that will be produced on a resist-coated surface from a shot which is not proximate to other shots. The corners of pattern 202 are rounded due to beam blur. In dosage graph 210, dosage curve 212 illustrates the cross-sectional dosage along a line 204 through shot outline 202. Line 214 denotes the resist threshold, which is the dosage above which the resist will register a pattern. As can be seen from dosage graph 210, dosage curve 212 is above the resist threshold between the X-coordinates "a" and "b". Coordinate "a" corresponds to dashed line 216, which denotes the left-most extent of the shot outline 202. Similarly, coordinate "b" corresponds to dashed line 218, which denotes the right-most extent of the shot outline 202. The shot dosage for the shot in the example of FIG. 2A is a normal dosage, as marked on dosage graph 210. In conventional mask writing methodology, the normal dosage is set so that a relatively large rectangular shot will register a pattern of the desired size on the resist-coated surface, in the absence of long-range effects. The normal dosage therefore depends on the value of the resist threshold 214.

Figure 2C:
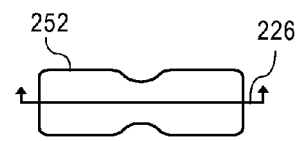
FIG. 2C illustrates an example of a pattern formed on a resist-coated surface from the pair of FIG. 2B shots.

FIG. 2B illustrates the shot outlines of two particle beam shots, and the corresponding dosage curve. Shot outline 222 and shot outline 224 result from two proximate particle beam shots. In dosage graph 220, dosage curve 230 illustrates the dosage along the line 226 through shot outlines 222 and 224. As shown in dosage curve 230, the dosage registered by the resist along line 226 is the combination, such as the sum, of the dosages from two particle beam shots, represented by shot outline 222 and shot outline 224. As can be seen, dosage curve 230 is above the threshold 214 from X-coordinate "a" to X-coordinate "d". This indicates that the resist will register the two shots as a single shape, extending from coordinate "a" to coordinate "d". FIG. 2C illustrates a pattern 252 that the two shots from the example of FIG. 2B may form. The variable width of pattern 252 is the result of the gap between shot outline 222 and shot outline 224, and illustrates that a gap between the shots 222 and 224 causes dosage to drop below threshold near the corners of the shot outlines closest to the gap.

When using non-overlapping shots using a single exposure pass, conventionally all shots are assigned a normal dosage before PEC dosage adjustment. A charged particle beam writer which does not support shot-by-shot dosage assignment can therefore be used by setting the base dosage to a normal dosage. If multiple exposure passes are used with such a charged particle beam writer, the base dosage is conventionally set according to the following equation:

base dosage=normal dosage/# of exposure passes

Figure 3A:
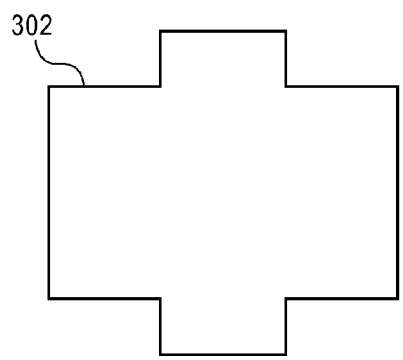
FIG. 3A illustrates an example of a polygonal pattern.
Figure 3B:
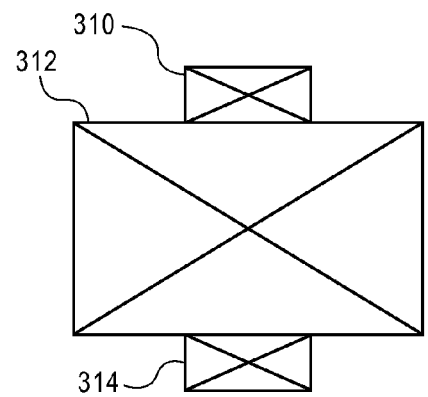
FIG. 3B illustrates an example of a conventional fracturing of the polygonal pattern of FIG. 3A.
Figure 3C:
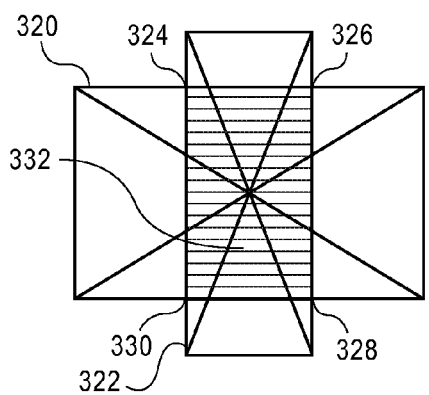
FIG. 3C illustrates an example of an alternate fracturing of the polygonal pattern of FIG. 3A.

FIGS. 3A-C illustrate two known methods of fracturing a polygonal pattern. FIG. 3A illustrates a polygonal pattern 302 that is desired to be formed on a surface. FIG. 3B illustrates a conventional method of forming this pattern using non-overlapping or disjoint shots. Shot outline 310, shot outline 312 and shot outline 314, which are marked with X's for clarity, are mutually disjoint. Additionally, the three shots associated with these shot outlines all use a desired normal dosage, before proximity effect correction. An advantage of using the conventional method as shown in FIG. 3B is that the response of the resist can be easily predicted. Also, the shots of FIG. 3B can be exposed using a charged particle beam system which does not allow dosage assignment on a shot-by-shot basis, by setting the base dosage of the charged particle beam writer to the normal dosage. FIG. 3C illustrates an alternate method of forming the pattern 302 on a resist-coated surface using overlapping shots, which is disclosed in U.S. Pat. No. 7,754,401. In FIG. 3C the constraint that shot outlines cannot overlap has been eliminated, and shot 320 and shot 322 do overlap. In the example of FIG. 3C, allowing shot outlines to overlap enables forming the pattern 302 in only two shots, compared to the three shots of FIG. 3B. In FIG. 3C, however the response of the resist to the overlapping shots is not as easily predicted as in FIG. 3B. In particular, the interior corners 324, 326, 328 and 330 may register as excessively rounded because of the large dosage received by overlapping region 332, shown by horizontal line shading. Charged particle beam simulation may be used to determine the pattern registered by the resist. In one embodiment disclosed in U.S. Pat. No. 8,062,813, which is owned by the assignee of the present patent application and incorporated by reference for all purposes, charged particle beam simulation may be used to calculate the dosage for each grid location in a two-dimensional (X and Y) grid, creating a grid of calculated dosages called a dosage map. The results of charged particle beam simulation may indicate use of non-normal dosages for shot 320 and shot 322. Additionally, in FIG. 3C the overlapping of shots in region 332 increases the area dosage—the dosage in the area proximate to pattern 302—beyond what it would be without shot overlap, thereby increasing backscatter. While the overlap of two individual shots will not increase the area dosage significantly, this technique will increase backscatter if used throughout a design.

In exposing, for example, a repeated pattern on a surface using charged particle beam lithography, the size of each pattern instance, as measured on the final manufactured surface, will be slightly different, due to manufacturing variations. The amount of the size variation is an essential manufacturing optimization criterion. In mask masking today, a root mean square (RMS) variation of no more than 1 nm (1 sigma) may be desired. More size variation translates to more variation in circuit performance, leading to higher design margins being required, making it increasingly difficult to design faster, lower-power integrated circuits. This variation is referred to as critical dimension (CD) variation. A low CD variation is desirable, and indicates that manufacturing variations will produce relatively small size variations on the final manufactured surface. In the smaller scale, the effects of a high CD variation may be observed as line edge roughness (LER). LER is caused by each part of a line edge being slightly differently manufactured, leading to some waviness in a line that is intended to have a straight edge. CD variation is inversely related to the slope of the dosage curve at the resist threshold, which is called edge slope. Therefore, edge slope, or dose margin, is a critical optimization factor for particle beam writing of surfaces.

FIG. 4A illustrates an example of an outline of a rectangular shot 402. FIG. 4B illustrates an example of a dosage graph 410 illustrating the dosage along the line 404 through shot outline 402 with a normal shot dosage, with no backscatter, such as would occur if shot 402 was the only shot within the range of the backscattering effect, which, as an example, may be 10 microns. Other long-range effects are also assumed to contribute nothing to the background exposure of FIG. 4B, leading to a zero background exposure level. The total dosage delivered to the resist is illustrated on the y-axis, and is 100% of a normal dosage. Because of the zero background exposure, the total dosage and the shot dosage are the same. Dosage graph 410 also illustrates the resist threshold 414. The CD variation of the shape represented by dosage graph 410 in the x-direction is inversely related to the slope of the dosage curve 412 at x-coordinates "a" and "b" where it intersects the resist threshold.

The FIG. 4B condition of zero background exposure is not reflective of actual designs. Actual designs will typically have many other shots within the backscattering distance of shot 402. FIG. 4C illustrates an example of a dosage graph 420 of a shot with a normal total dosage with non-zero background exposure 428. In this example, a background exposure of 20% of a normal dosage is shown. In dosage graph 420, dosage curve 422 illustrates the cross-sectional dosage of a shot similar to shot 402. The CD variation of curve 422 is worse than the CD variation of curve 412, as indicated by the lower edge slope where curve 422 intersects resist threshold 424 at points "a" and "b", due to the background exposure caused by backscatter.

One method of increasing the slope of the dosage curve at the resist threshold is to increase the shot dosage. FIG. 4D illustrates an example of a dosage graph 430 with a dosage curve 432 which illustrates a total dosage of 150% of normal dosage, with no background exposure. With no background exposure, the shot dosage equals the total dosage. Threshold 434 in FIG. 4D is unchanged from threshold 414 in FIG. 4B. Increasing shot dosage increases the size of a pattern registered by the resist. Therefore, to maintain the size of the resist pattern, illustrated as the intersection points of dosage curve 432 with threshold 434, the shot size used for dosage graph 430 is somewhat smaller than shot 402. As can be seen, the slope of dosage curve 432 is higher where it intersects threshold 434 than is the slope of dosage curve 412 where it intersects threshold 414, indicating a lower, improved, CD variation for the higher-dosage shot of FIG. 4D than for the normal dosage shot of FIG. 4B.

Like dosage graph 410, however, the zero background exposure condition of dosage graph 430 is not reflective of actual designs. FIG. 4E illustrates an example of a dosage graph 440 with the shot dosage adjusted to achieve a total dosage on the resist of 150% of normal dosage with a 20% background exposure, such as would occur if the dosage of only one shot was increased to achieve total dosage of 150% of a normal dosage, and dosage of other shots remained at 100% of normal dosage. The threshold 444 is the same as in FIGS. 4B-4D. The background exposure is illustrated as line 448. As can be seen, the slopes of dosage curve 442 at x-coordinates "a" and "b" are less than the slopes of dosage curve 432 at x-coordinates "a" and "b" because of the presence of backscatter. Comparing graphs 420 and 440 for the effect of shot dosage, the slope of dosage curve 442 at x-coordinates "a" and "b" is higher than the slope of dosage curve 422 at the same x-coordinates, indicating that improved edge slope can be obtained for a single shot by increasing dosage, if dosages of other shots remain the same.

FIG. 4F illustrates an example of a dosage graph 450, illustrating the case where the dosages of all shots have been increased to 150% of normal dose. Two background dosage levels are shown on dosage graph 450: a 30% background dose 459, such as may be produced if all shots use 150% of normal dosage, and a 20% background dose 458 shown for comparison, since 20% is the background dosage in the dosage graph 440. Dosage curve 452 is based on the 30% background dose 459. As can be seen, the edge slope of dosage curve 452 at x-coordinates "a" and "b" is less than that of dosage curve 442 at the same points.

In summary, FIGS. 4A-F illustrate that higher-than-normal dosage can be used selectively to lower CD variation for isolated shapes. Increasing dosage has two undesirable effects, however. First, an increase in dose is achieved in modern charged particle beam writers by lengthening exposure time. Thus, an increase in dose increases the writing time, which increases cost. Second, as illustrated in FIGS. 4E-F, if many shots within the backscatter range of each other use an increased dosage, the increase in backscatter reduces the edge slope of all shots, thereby worsening CD variation for all shots of a certain assigned dosage. The only way for any given shot to avert this problem is to increase dosage and shoot a smaller size. However, doing this increases the backscatter even more. This cycle causes all shots to be at a higher dose, making write times even worse. Therefore, it is better to increase dose only for shots that define the edge.

Edge slope or dose margin is an issue only at pattern edges. If, for example, the normal dosage is 2× the resist threshold, so as to provide a good edge slope, the interior areas of patterns can have a dosage lower than normal dosage, so long as dosage in all interior areas remains above the resist threshold, after accounting for some margin for manufacturing variation. In the present disclosure, two methods of reducing the dosage of interior areas of a pattern are disclosed:

If assigned shot dosages are available, use lower-than-normal shot dosages.

Insert gaps between shots in the interior of patterns. Although the shot outlines may show gaps, if the dosage within the gap area is everywhere above the resist threshold, with margin provided for manufacturing variation, no gap will be registered by the resist.

Either or both of these techniques will reduce the area dosage, thus reducing the background dosage caused by backscatter. Edge slope at the pattern edges will therefore be increased, thereby improving CD variation.

Optimization techniques may be used to determine the lowest dosage that can be achieved in interior portions of the pattern. In some embodiments, these optimization techniques will include calculating the resist response to the set of shots, such as with using particle beam simulation, so as to determine that the set of shots forms the desired pattern, perhaps within a predetermined tolerance. Note that when creating shots for a charged particle beam writer which supports only unassigned dosage shots, gaps can be used in interior areas of the pattern to reduce area dosage. By simulating, particularly with the "corner cases" of the manufacturing tolerance, designs with lower doses or gaps can be pre-determined to shoot the desired shapes safely with reduced write time and improved edge slope.

Figure 5A:
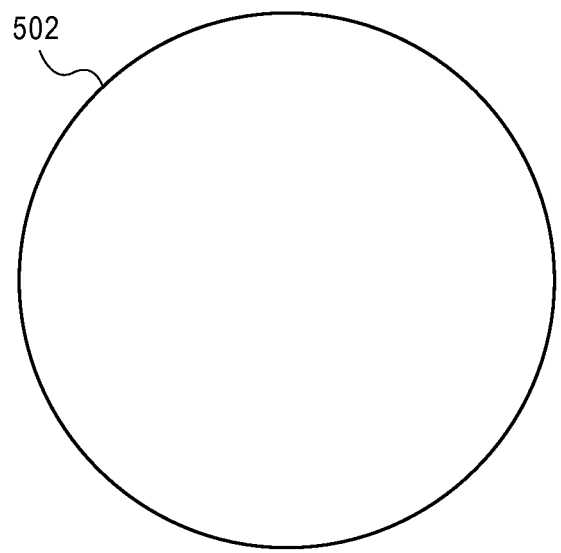
FIG. 5A illustrates an example of a circular pattern to be formed on a surface.
Figure 5B:
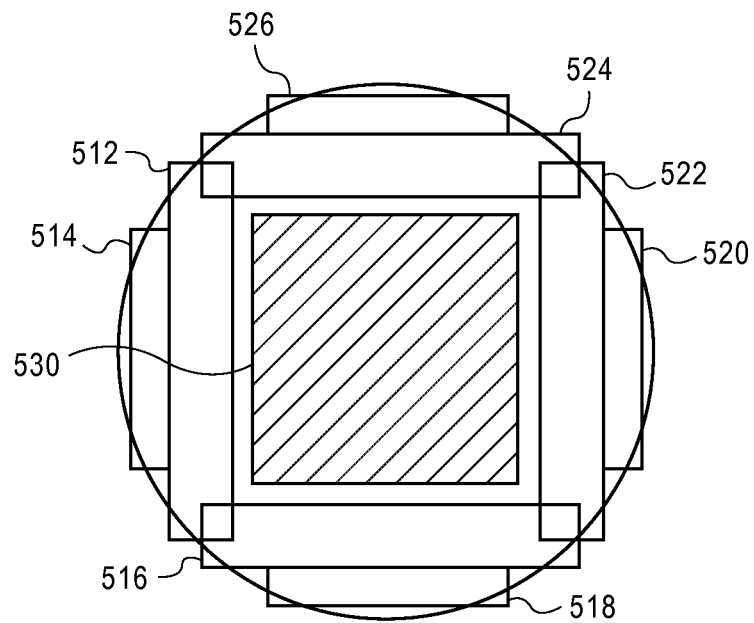
FIG. 5B illustrates an example of outlines of nine shots which can form the pattern of FIG. 5A.

FIG. 5A illustrates an example of a circular pattern 502 that is to be formed on a surface. FIG. 5B illustrates an example of how the pattern 502 may be formed with a set of nine VSB shots with assigned shot dosages. FIG. 5B illustrates the shot outlines of each of the nine shots. In FIG. 5B, overlapping shots 512, 514, 516, 518, 520, 522, 524 and 526 may be assigned a relatively higher set of dosages, or in some embodiments all assigned a normal dosage, to maintain a good edge slope, since each of these shots defines the perimeter of the pattern on the surface. Shot 530, however, may have an assigned dosage less than shots 512, 514, 516, 518, 520, 522, 524 and 526, such as 0.7× a normal dosage, since shot 530 does not define an edge of the pattern. That is, different dosages are provided to different parts of the pattern. The shot sizes will be carefully chosen so as not to have any portion of the interior of shape 502 fall below the resist threshold, perhaps with some margin for manufacturing variation. Shot 530 may also be sized so that a gap exists between the outline of shot 530 and the outline of each of the adjacent shots, as illustrated in FIG. 5B. When a gap is present, the union of outlines of shots in the set of shots does not cover the desired pattern. Particle beam simulation may be used to determine an optimal size for the gap so that dosage may be reduced without causing a gap to be registered by the resist. The use of lower-than-normal dosage for shot 530, when applied to a large number of such shots within the backscatter range of each other, will reduce the backscatter and fogging, contributing to improved edge slope, compared to exposing shot 530 and the large number of other shots within the backscatter range with a normal dosage.

The solution described above with FIG. 5B may be implemented even using a charged particle beam system that does not allow dosage assignment for individual shots. In one embodiment of the present invention, a small number of dosages may be selected, for example two dosages such as 1.0× normal and 0.7× normal, and shots for each of these two dosages may be separated and exposed in two separate exposures passes, where the base dosage for one exposure pass is 1.0× normal and the base dosage for the other exposure pass is 0.7× normal. In the example of FIG. 5B, shots 512, 514, 516, 518, 520, 522, 524 and 526 may be assigned to a first exposure pass which uses a base dosage of 1.0× normal dosage before PEC correction. Shot 530 may be assigned to a second exposure pass which uses a base dosage of 0.7× normal dosage before PEC correction.

Overlapping shots may be used to create resist dosages greater than 100% of normal, even with charged particle beam writers which do not support dosage assignment for individual shots. In FIG. 5B, for example outlines for shots 514 and 512, shots 526 and 524, shots 520 and 522, and shots 518 and 516 may be designed to overlap, creating regions of higher-than-normal dosage in the periphery. The higher energy that is cast from these regions can "fill in" the gap between shot outline 530 and the peripheral shots, making it possible to decrease the size of shot 530.

Figure 6A:
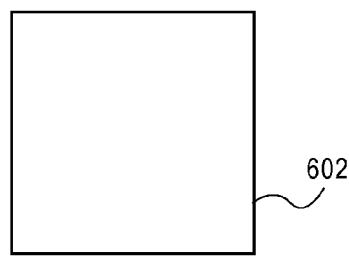
FIG. 6A illustrates a square pattern to be formed on a surface.
Figure 6B:
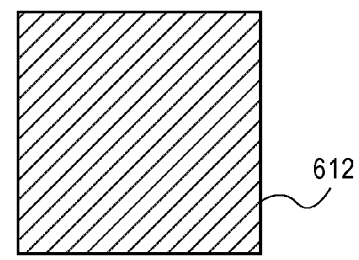
FIG. 6B illustrates a single-shot method of forming the pattern of FIG. 6A on a surface.
Figure 6C:
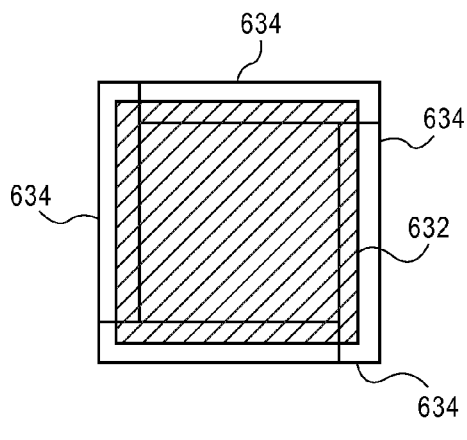
FIG. 6C illustrates an example of a method of forming the pattern of FIG. 6A on a surface by another embodiment of the current invention.

FIGS. 6A-D illustrate the use of overlapping shots with square patterns, such as are commonly used for contact and via patterns in integrated circuit design. FIG. 6A illustrates an example of a desired pattern 602 to be formed on a reticle. FIG. 6B illustrates a single VSB shot 612 which may be used to form pattern 602 conventionally. Use of single shot 612 may cause edge slope to be undesirably low, however. FIG. 6C illustrates an example of an embodiment of the present invention. FIG. 6C may be shot using five VSB shots, including shot 632, which is cross-hatched, and four additional shots 634 around the perimeter areas of the original pattern 602. Also, a CP character may be designed to expose the pattern illustrated by the four rectangles 634 in a single CP shot, allowing FIG. 6C to be exposed in one VSB shot 632 and one CP shot for all shapes 634. The use of the perimeter CP shot or VSB shots can increase the edge slope of the entire perimeter of the transferred pattern by increasing peak dosage near the perimeter, compared to the interior area, thus also providing different dosages to different parts of the pattern. The small perimeter CP shot or VSB shots do not increase the area dosage as much as if a higher dosage was used for shot 612, reducing the backscatter compared to if a higher dosage shot 612 was used alone.

Figure 6D:
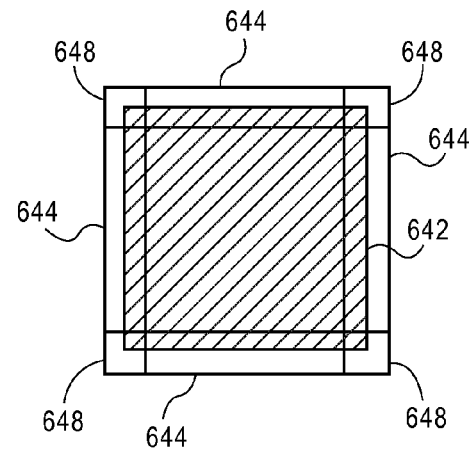
FIG. 6D illustrates an example of a method of forming the pattern of FIG. 6A on a surface by yet another embodiment of the current invention.

FIG. 6D illustrates an example of another embodiment of the present invention. Nine regions are illustrated in FIG. 6D: a) a large region 642, b) four side regions 644, and c) four corner regions 648. As can be seen, all regions 644 and 648 overlap region 642. These regions may be exposed by any of the following methods:

Nine separate VSB shots, including one for region 642, four shots for the four regions 644, and four shots for the four corner regions 648.

Five VSB shots. Region 642 is exposed by one shot. For the remaining four VSB shots, each shot includes the union of one side region 644 and two corner regions 648 adjacent to the side regions. This provides a higher dosage at the corners than along the side perimeters. The additional peak exposure near the corner may provide improved accuracy and/or edge slope.

One VSB shot for region 642 and two CP shots—one shot each of two CP characters. One CP character may be designed, for example to include the four side regions 644 and a second CP character may be designed to include the four corner regions 648. This solution allows independent dosage control of the corner regions and non-corner side regions.

The method using one VSB shot with two CP shots should require less exposure time than either the nine-shot VSB or the five-shot VSB methods. Additionally, the size of shot 642 may be modified to be smaller than the desired pattern 602.

The solution described above with FIG. 6C may be implemented even using a charged particle beam system that does not allow dosage assignment for individual shots. In one embodiment of the present invention, a small number of dosages may be selected, for example two dosages such as 1.0× normal and 0.6× normal, and shots for each of these two dosages may be separated and exposed in two separate exposures passes, where the base dosage for one exposure pass is 1.0× normal and the base dosage for the other exposure pass is 0.6× normal. In the example of FIG. 6C, shot 632 may be assigned to a first exposure pass which uses a base dosage of 1.0× normal dosage before PEC correction. The four shots 634 may be assigned to a second exposure pass which uses a base dosage of 0.6× normal dosage before PEC correction. Thus, overlapping shots can create pattern dosages greater than 100% of normal, even with charged particle beam writers which do not support dosage assignment for individual shots.

In one embodiment of the invention, gaps between normal-dosage or near-normal-dosage shots may be filled or partially filled with low-dosage shots, such as shots having less than 50% of normal dosage.

The calculations described or referred to in this invention may be accomplished in various ways. Generally, calculations may be accomplished by in-process, pre-process or post-process methods. In-process calculation involves performing a calculation at the time when its results are needed. Pre-process calculation involves pre-calculating and then storing results for later retrieval during a subsequent processing step, and may improve processing performance, particularly for calculations that may be repeated many times. Calculations may also be deferred from a processing step and then done in a later post-processing step. An example of pre-process calculation is pre-calculating PEC dosage adjustments for various values of backscatter. Another example of pre-process calculation is a shot group, which is a pre-calculation of dosage pattern information for one or more shots associated with a given input pattern or set of input pattern characteristics. The shot group and the associated input pattern may be saved in a library of pre-calculated shot groups, so that the set of shots comprising the shot group can be quickly generated for additional instances of the input pattern, without pattern re-calculation. In some embodiments, the pre-calculation may comprise simulation of the dosage pattern that the shot group will produce on a resist-coated surface. In other embodiments, the shot group may be determined without simulation, such as by using correct-by-construction techniques. In some embodiments, the pre-calculated shot groups may be stored in the shot group library in the form of a list of shots. In other embodiments, the pre-calculated shot groups may be stored in the form of computer code that can generate shots for a specific type or types of input patterns. In yet other embodiments, a plurality of pre-calculated shot groups may be stored in the form of a table, where entries in the table correspond to various input patterns or input pattern characteristics such as pattern width, and where each table entry provides either a list of shots in the shot group, or information for how to generate the appropriate set of shots. Additionally, different shot groups may be stored in different forms in the shot group library. In some embodiments, the dosage pattern which a given shot group can produce may also be stored in the shot group library. In one embodiment, the dosage pattern may be stored as a two-dimensional (X and Y) dosage map called a glyph.

Figure 7:
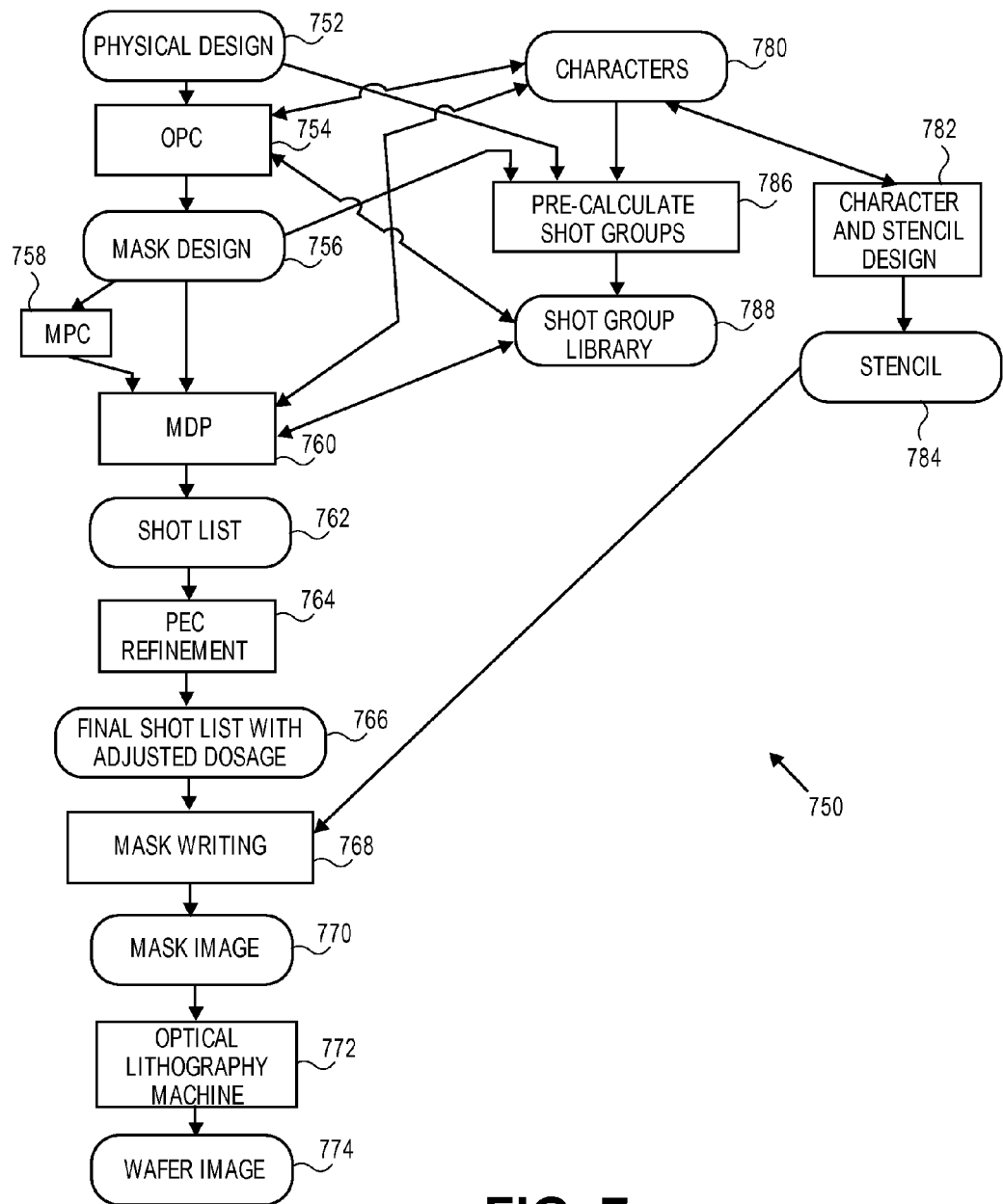
FIG. 7 illustrates a conceptual flow diagram of how to prepare a surface, such as a reticle, for use in fabricating a substrate such as an integrated circuit on a silicon wafer using optical lithography.

FIG. 7 is an exemplary conceptual flow diagram 750 of how to prepare a reticle for use in fabricating a surface such as an integrated circuit on a silicon wafer. In a first step 752, a physical design, such as a physical design of an integrated circuit, is designed. This can include determining the logic gates, transistors, metal layers, and other items that are required to be found in a physical design such as that in an integrated circuit. The physical design may be rectilinear, partially curvilinear, or completely curvilinear. Next, in a step 754, optical proximity correction is determined. In an embodiment of this disclosure this can include taking as input a library of pre-calculated shot groups from a shot group library 788. This can also alternatively, or in addition, include taking as input a library of pre-designed characters 780 including complex characters that are to be available on a stencil 784 in a step 768. In an embodiment of this disclosure, an OPC step 754 may also include simultaneous optimization of shot count or write times, and may also include a fracturing operation, a shot placement operation, a dose assignment operation, or may also include a shot sequence optimization operation or dose margin optimization, or other mask data preparation operations, with some or all of these operations being simultaneous or combined in a single step. The OPC step 754 may create partially or completely curvilinear patterns. The output of the OPC step 754 is a mask design 756.

Mask process correction (MPC) 758 may optionally be performed on the mask design 756. MPC modifies the pattern to be written to the mask so as to compensate for non-linear effects, such as effects associated with patterns smaller than about 100 nm in conventional optical lithographic masks. MPC may also be used to compensate for non-linear effects affecting EUV masks. If MPC 758 is performed, its output becomes the input for mask data preparation (MDP) step 760.

In a step 760, a mask data preparation operation which may include a fracturing operation, a shot placement operation, a dose assignment operation, or a shot sequence optimization may take place. MDP may use as input the mask design 756 or the results of MPC 758. In some embodiments of the present invention, MPC may be performed as part of a fracturing or other MDP operation. Other corrections may also be performed as part of fracturing or other MDP operation, the possible corrections including: forward scattering, resist diffusion, Coulomb effect, etching, backward scattering, fogging, loading, resist charging, and EUV midrange scattering. The result of MDP step 760 is a shot list 762, either for one or for multiple exposure passes in mask writing step 768. Either OPC step 754 or MDP step 760, or a separate program 786 can include pre-calculating one or more shot groups that may be used for a given input pattern, and storing this information in a shot group library 788. Combining OPC and any or all of the various operations of mask data preparation in one step is contemplated in this disclosure. Mask data preparation step 760, which may include a fracturing operation, may also comprise a pattern matching operation to match pre-calculated shot groups to create a mask image 770 that matches closely to the mask design 756. Mask data preparation 760 may also include calculating the dose margin, and may also include optimizing the dose margin. In some embodiments, optimization may include varying shot dosages to produce a higher peak dosage near perimeters of generated patterns than in the interior of the generated patterns. In other embodiments, generated shots may have gaps between the shot outlines of nearest neighboring shots, so that area dosage is decreased, but where the gaps are sufficiently small that they will not be registered by the resist in the subsequently-produced mask image 770. In another embodiment, mask data preparation 760 may include optimization by changing the size of the gaps. In another embodiment, mask data preparation 760 may include revising the initially-determined set of shots if the calculated dose margin is below a pre-determined target dose margin, and recalculating the dose margin with the revised set of shots. Mask data preparation 760 may also comprise inputting patterns to be formed on a surface with the patterns being slightly different, selecting a set of characters to be used to form the number of patterns, the set of characters fitting on a stencil mask, the set of characters possibly including both complex and VSB characters, and the set of characters based on varying character dose or varying character position or applying partial exposure of a character within the set of characters or dragging a character to reduce the shot count or total write time. A set of slightly different patterns on the surface may be designed to produce substantially the same pattern on a substrate. Also, the set of characters may be selected from a predetermined set of characters. In one embodiment of this disclosure, a set of characters available on a stencil in the step 780 that may be selected quickly during the mask writing step 768 may be prepared for a specific mask design. In that embodiment, once the mask data preparation step 760 is completed, a stencil is prepared in the step 784. In another embodiment of this disclosure, a stencil is prepared in the step 784 prior to or simultaneous with the MDP step 760 and may be independent of the particular mask design. In this embodiment, the characters available in the step 780 and the stencil layout are designed in step 782 to output generically for many potential mask designs 756 to incorporate patterns that are likely to be output by a particular OPC program 754 or a particular MDP program 760 or particular types of designs that characterizes the physical design 752 such as memories, flash memories, system on chip designs, or particular process technology being designed to in physical design 752, or a particular cell library used in physical design 752, or any other common characteristics that may form different sets of slightly different patterns in mask design 756. The stencil can include a set of characters, such as a limited number of characters that was determined in the step 760.

In step 764 proximity effect correction (PEC) refinement may be performed on shot list 762 to create a final shot list 766 with adjusted dosages. The final shot list 766 is used to generate a surface in a mask writing step 768, which uses a charged particle beam writer such as an electron beam writer system. In some embodiments, PEC refinement 764 may be performed by the charged particle beam writer. Mask writing step 768 may use stencil 784 containing both VSB apertures and a plurality of complex characters, or may use a stencil comprising only VSB apertures. Mask writing step 768 may comprise a single exposure pass or multiple exposure passes. The electron beam writer system projects a beam of electrons through the stencil onto a surface to form a mask image comprising patterns on a surface, as shown in a step 770. The completed surface may then be used in an optical lithography machine, which is shown in a step 772. Finally, in a step 774, a substrate such as a silicon wafer is produced.

As has been previously described, in step 780 characters may be provided to the OPC step 754 or the MDP step 760. The step 780 also provides characters to a character and stencil design step 782 or to a shot group pre-calculation step 786. The character and stencil design step 782 provides input to the stencil step 784 and to the characters step 780. The shot group pre-calculation step 786 provides information to the shot group library 788. Also, the shot group pre-calculation step 786 may use as input the physical design 752 or the mask design 756, and may pre-calculate one or more shot groups, which are stored in a shot group library 788.

Figure 8:
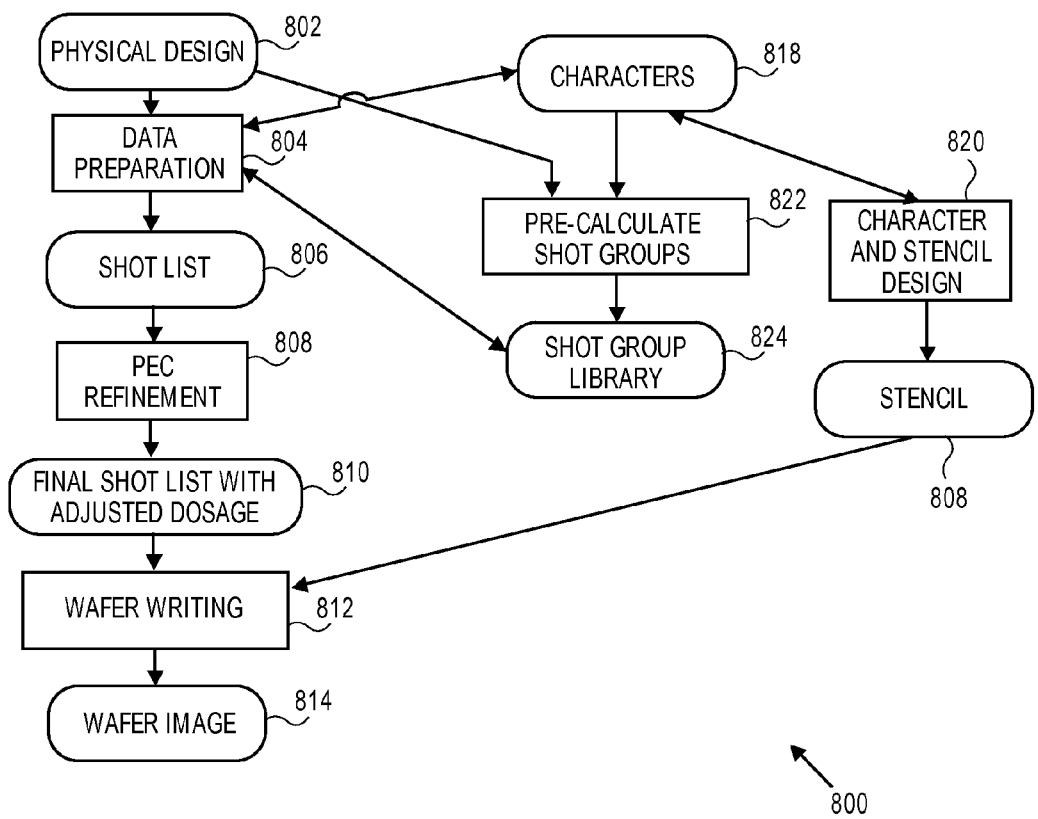
FIG. 8 illustrates a conceptual flow diagram of how to prepare a surface for use in fabricating a substrate such as an integrated circuit on a silicon wafer.

Referring now to FIG. 8, another exemplary conceptual flow diagram 800 of how to prepare a surface which is directly written on a substrate such as a silicon wafer is shown. In a first step 802, a physical design, such as a physical design of an integrated circuit is designed. This may be an ideal pattern that the designer wants transferred onto a substrate. Next, in a step 804, various data preparation (DP) steps are performed to prepare input data to a substrate writing device. Step 804 may include fracturing of the patterns into a set of VSB and/or complex CP shots, where some of the shots may overlap each other. Other corrections may also be performed as part of fracturing or other DP operations, the possible corrections including: forward scattering, resist diffusion, Coulomb effect, etching, backward scattering, fogging, loading, and resist charging. Either DP step 804 or a separate program 822 can include pre-calculating one or more shot groups that may be used for a given input pattern, and storing this information in a shot group library 824. The step 804 may also comprise pattern matching to match pre-calculated shot groups to create a wafer image 814 that matches closely to the physical design created in the step 802. Iterations of pattern matching, dose assignment, and equivalence checking may also be performed. In one embodiment, there may be a single iteration where a correct-by-construction "deterministic" calculation is performed. Data preparation 804 may include calculating the dose margin, and may also include optimizing the dose margin. In some embodiments optimization may include varying shot dosages to produce a higher peak dosage near perimeters of the generated patterns than in the interior of the generated patterns. In other embodiments, generated shots may have gaps between nearest neighboring shots, so that area dosage is decreased, but where the gaps are sufficiently small that they will not be registered by the resist in the subsequently-produced wafer image 814. In another embodiment, step 804 may include optimization by changing the size of the gaps. In another embodiment, data preparation 804 may include revising the initially-determined set of shots if the calculated dose margin is below a pre-determined target dose margin, and recalculating the dose margin with the revised set of shots. The output of step 804 is shot list 806.

In step 808 proximity effect correction (PEC) may be performed on shot list 806 to create a final shot list 810 with adjusted dosages. The final shot list 810 is used to create a pattern on a surface such as an image on a wafer 814 in a wafer writing step 812 which uses a charged particle beam writer such as an electron beam writer system. In some embodiments, PEC refinement 808 may be performed by the charged particle beam writer. Wafer writing step 812 may use stencil 808 containing both VSB apertures and a plurality of complex characters, or may use a stencil comprising only VSB apertures. In wafer writing step 812, the electron beam writer system projects a beam of electrons through the stencil onto a surface to form an image 814 comprising patterns on the surface. Wafer writing step 812 may comprise a single exposure pass or multiple exposure passes.

As has been previously described, in step 818 characters may be provided to DP step 804. Step 818 also provides characters to a character and stencil design step 820 or to a shot group pre-calculation step 822. The character and stencil design step 820 provides input to the stencil step 808 and to the characters step 818. The shot group pre-calculation step 822 provides information to the shot group library 824. Also, the shot group pre-calculation step 822 may use as input the physical design 802 and may pre-calculate one or more shot groups, which are stored in a shot group library 824.

The step 812 may include repeated application as required for each layer of processing, potentially with some processed using the methods described in association with FIG. 7, and others processed using the methods outlined above with respect to FIG. 8, or others produced using any other wafer writing method to produce integrated circuits on the silicon wafer.

The fracturing, MDP, OPC, MPC and PEC flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, mask data preparation, and proximity effect correction may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for fracturing or mask data preparation or proximity effect correction or optical proximity correction or mask process correction comprising the step of:

determining a plurality of shaped beam charged particle beam shots for an exposure pass, wherein the plurality of shaped beam shots, when used in a charged particle beam writer, produces a dosage on a resist-coated surface, wherein the dosage on the resist-coated surface forms a pattern on the resist-coated surface, wherein the pattern on the surface comprises a pattern perimeter, wherein the resist comprises a resist threshold, wherein the plurality of shaped beam shots provides different dosages to different parts of the pattern, wherein the step of determining comprises calculating a dose margin from the plurality of shaped beam shots, wherein the dose margin is a slope of the resist dosage, at the resist threshold, with respect to a linear dimension perpendicular to the pattern perimeter, and wherein the step of determining is performed using one or more computing hardware processors.

2. The method of claim 1 wherein the dose margin is optimized.

3. The method of claim 2 wherein the plurality of shaped beam shots produces a higher resist dosage peak near the pattern perimeter than in an interior area of the pattern on the surface.

4. The method of claim 1 wherein the calculating comprises charged particle beam simulation.

5. The method of claim 4 wherein the charged particle beam simulation includes at least one of a group consisting of forward scattering, backward scattering, resist diffusion, Coulomb effect, etching, fogging, loading and resist charging.

6. The method of claim 1, further comprising the step of revising the plurality of shaped beam shots and recalculating the dose margin if the dose margin is lower than a pre-determined target dose margin.

7. The method of claim 1 wherein each shot in the plurality of shaped beam shots comprises an assigned dosage, and wherein the assigned dosages of at least two shots in the plurality of shaped beam shots differ from each other before dosage correction for long-range effects.

8. The method of claim 1 wherein each shot in the plurality of shaped beam shots is a variable shaped beam (VSB) shot.

9. The method of claim 1 wherein the surface comprises a reticle to be used in an optical lithographic process to manufacture a substrate.

10. A method for manufacturing a surface using charged particle beam lithography, the method comprising the steps of:

determining a plurality of shaped beam shots for a plurality of exposure passes; and forming a pattern on the surface, wherein the surface has been coated with a resist, wherein a charged particle beam writer produces a dosage on the resist-coated surface using the plurality of shaped beam shots, wherein the dosage on the resist-coated surface forms the pattern, wherein the pattern on the surface comprises a pattern perimeter, wherein the resist comprises a resist threshold, wherein the plurality of shaped beam shots provides different dosages to different parts of the pattern, wherein the step of determining comprises calculating a dose margin from the plurality of shaped beam shots, and wherein the dose margin is a slope of the resist dosage, at the resist threshold, with respect to a linear dimension perpendicular to the pattern perimeter.

11. The method of claim 10 wherein the dose margin is optimized.

12. The method of claim 11 wherein the plurality of shaped beam shots produces a higher resist dosage peak near the pattern perimeter on the surface than in an interior area of the pattern on the surface.

13. The method of claim 10 wherein the calculating comprises charged particle beam simulation.

14. The method of claim 13 wherein the charged particle beam simulation includes at least one of a group consisting of forward scattering, backward scattering, resist diffusion, Coulomb effect, etching, fogging, loading and resist charging.

15. The method of claim 10, further comprising the step of revising the plurality of shaped beam shots and recalculating the dose margin if the dose margin is lower than a pre-determined target dose margin.

16. The method of claim 10 wherein each shot in the plurality of shaped beam shots comprises an assigned dosage, and wherein the assigned dosages of at least two shots in the plurality of shaped beam shots differ before dosage correction for long-range effects.

17. The method of claim 16, further comprising the step of performing dose correction for long-range effects, wherein the assigned dosages of at least two shots in the plurality of shaped beam shots differ from each other before the dose correction.

18. The method of claim 10 wherein the surface comprises a reticle to be used in an optical lithographic process to manufacture a substrate.

19. A method for manufacturing an integrated circuit using an optical lithographic process, the optical lithographic process using a reticle manufactured with charged particle beam lithography, the method comprising the steps of:

determining a plurality of shaped beam shots for an exposure pass; and forming a pattern on the reticle, wherein the reticle has been coated with a resist, wherein a charged particle beam writer produces a dosage on the resist-coated reticle using the plurality of shaped beam shots, wherein the dosage on the resist-coated reticle forms the pattern, wherein the pattern on the reticle comprises a pattern perimeter, wherein the resist comprises a resist threshold, wherein the plurality of shaped beam shots provides different dosages to different parts of the pattern, and wherein the step of determining comprises calculating a dose margin from the plurality of shaped beam shots, and wherein the dose margin is a slope of the resist dosage, at the resist threshold, with respect to a linear dimension perpendicular to the pattern perimeter.

20. The method of claim 19 wherein the calculating comprises charged particle beam simulation.

21. The method of claim 20 wherein the charged particle beam simulation includes at least one of a group consisting of forward scattering, backward scattering, resist diffusion, Coulomb effect, etching, fogging, loading and resist charging.

22. A system for fracturing or mask data preparation or proximity effect correction or optical proximity correction or mask process correction comprising:

a device configured to determine a plurality of shaped beam charged particle beam shots for an exposure pass, wherein the plurality of shaped beam shots, when used in a charged particle beam writer, produces a dosage on a resist-coated surface, wherein the dosage on the resist-coated surface forms a pattern on the surface, wherein the pattern on the surface comprises a pattern perimeter, wherein the resist comprises a resist threshold, wherein the plurality of shaped beam shots provides different dosages to different parts of the pattern, and wherein the device configured to determine calculates a dose margin from the plurality of shaped beam shots, and wherein the dose margin is a slope of the resist dosage, at the resist threshold, with respect to a linear dimension perpendicular to the pattern perimeter.

23. The system of claim 22 wherein the dose margin is optimized.

24. The system of claim 23 wherein the plurality of shaped beam shots produces a higher resist dosage peak near the pattern perimeter than in an interior area of the pattern on the surface.

25. The system of claim 22 wherein each shot in the plurality of shaped beam shots is a variable shaped beam (VSB) shot.

* * * * *